United States Patent
Gotou (10) Patent No.: US 8,890,371 B2
(45) Date of Patent: Nov. 18, 2014

(54) ALTERNATING CURRENT/DIRECT CURRENT TWO-WAY SWITCH

(75) Inventor: Kiyoshi Gotou, Osaka (JP)

(73) Assignee: Panasonic Corporation, Osaka (JP)

( * ) Notice: Subject to any disclaimer, the term of this patent is extended or adjusted under 35 U.S.C. 154(b) by 510 days.

(21) Appl. No.: 13/329,556

(22) Filed: Dec. 19, 2011

(65) Prior Publication Data

US 2012/0086427 A1    Apr. 12, 2012

Related U.S. Application Data

(63) Continuation of application No. PCT/IB2010/001417, filed on Jun. 14, 2010.

(30) Foreign Application Priority Data

Jun. 17, 2009  (JP) .................. 2009-144382

(51) Int. Cl.
  *H02M 1/08*   (2006.01)
  *H03K 17/687* (2006.01)
  *H03K 17/691* (2006.01)
  *H03K 17/16*  (2006.01)

(52) U.S. Cl.
  CPC ........ *H03K 17/6871* (2013.01); *H03K 17/6874* (2013.01); *H03K 17/691* (2013.01); *H03K 17/162* (2013.01); *H02M 1/08* (2013.01); *H02M 1/083* (2013.01); *H03K 2217/0009* (2013.01)
  USPC ....................................... 307/128

(58) Field of Classification Search
  CPC .................. H02M 1/08; G05F 3/02
  USPC ........................................... 307/128
  See application file for complete search history.

(56) References Cited

U.S. PATENT DOCUMENTS

| | | | |
|---|---|---|---|
| 5,610,807 A | 3/1997 | Kanda et al. | |
| 7,465,997 B2 * | 12/2008 | Kinzer et al. | ................. 257/401 |
| 7,595,680 B2 | 9/2009 | Morita et al. | |

(Continued)

FOREIGN PATENT DOCUMENTS

| CN | 2079393 U | 6/1991 |
|---|---|---|
| CN | 201039758 Y | 3/2008 |

(Continued)

OTHER PUBLICATIONS

European Search Report dated Dec. 13, 2013 issued in corresponding European application No. 10789078.2-1805.

(Continued)

*Primary Examiner* — Hal Kaplan
(74) *Attorney, Agent, or Firm* — Bacon & Thomas, PLLC (57) ABSTRACT

There is provided an AC/DC two-way switch connected between an AC power source or a DC power source and a load to control a power supply to the load. The AC/DC two-way switch includes: a bi-directional semiconductor switch element having a transistor structure connected in series between a power source and the load; a rectifying unit connected in parallel between the first input terminal and a second input terminal; a power source unit for converting an output voltage from the rectifying unit into a stable voltage; and a controller for controlling an entire operation of the AC/DC two-way switch. The AC/DC two-way switch further includes a driving unit for turning on the bi-directional semiconductor switch element in response to a control signal.

15 Claims, 11 Drawing Sheets

(56) References Cited

U.S. PATENT DOCUMENTS

| | | |
|---|---|---|
| 2005/0162139 A1 | 7/2005 | Hirst |
| 2007/0236152 A1 | 10/2007 | Davis et al. |
| 2008/0143421 A1 | 6/2008 | Yanagihara et al. |

FOREIGN PATENT DOCUMENTS

| | | |
|---|---|---|
| JP | 5678125 | 6/1981 |
| JP | 575433 | 1/1982 |
| JP | S57-5433 | 1/1982 |
| JP | S60-46575 B2 | 1/1982 |
| JP | 8149826 | 6/1996 |
| JP | 8308217 | 11/1996 |
| JP | 2001157380 | 6/2001 |
| JP | 2003304145 | 10/2003 |
| JP | 20056478 | 1/2005 |
| JP | 2005210891 | 8/2005 |
| JP | 2005293317 | 10/2005 |
| JP | 2007236173 | 9/2007 |
| JP | 2008153748 | 7/2008 |
| JP | 2009124667 | 6/2009 |

OTHER PUBLICATIONS

Korean Office Action dated May 8, 2013 and English translation thereof.
Taiwanese Office Action dated Jul. 19, 2013 and English translation of Search Report.
Chinese Office Action dated Jun. 18, 2014 with English translation of Search Report.
Canadian Office Action dated Jun. 25, 2014.

* cited by examiner

IN CASE OF AC POWER SOURCE

*FIG.8C*

IN CASE OF DC POWER SOURCE

(Prior Art)

ALTERNATING CURRENT/DIRECT CURRENT TWO-WAY SWITCH

This application is a Continuation Application of PCT International Application No. PCT/IB2010/001417 filed on Jun. 14, 2010, which designated the United States.

FIELD OF THE INVENTION

The present invention relates to an alternating current/direct current (AC/DC) two-way switch usable for both AC and DC that supplies an AC or DC power to a load therethrough and stops supplying of power.

BACKGROUND OF THE INVENTION

Conventionally, an AC distribution system based on a commercial power has been used to supply power to various electric devices in a house. Recently, there becomes widely used a DC decentralized power supply system using a solar cell (photovoltaic power generation), a fuel cell, a storage battery, or the like provided in the house. Also, in order to reduce a power loss in converting an AC power into a DC power in each electronic device, there is proposed an introduction of a home DC distribution system. In these cases, a DC distribution system is required to be installed in addition to the related conventional AC distribution system.

In case of the AC distribution system, since a current zero cross point exists once every half period, current can be easily cut even when a contact switching type switch is used. However, in case of the DC distribution system, since there is no current zero cross point and an arc is generated in cutting current even at a relatively low voltage (e.g., about 40V), the distance between contacts needs to be increased or an arc extinguishing function such as an electromagnet or the like needs to be provided. This makes, compared with the switch in the AC distribution system, the switch itself in the DC distribution system larger.

Further, in case of photovoltaic power generation, a fuel cell or the like, since it includes a high voltage of a few hundred V, it is necessary to perform a powerful arc extinguishing function as well as to increase the distance between contacts in order to effectively cut a current flowing therethrough. Thus, it is not easy to substitute a switch for the existing AC distribution system with a switch for a DC distribution system or combine the switch for the DC distribution system with the switch for the existing AC distribution system. Furthermore, the presence of switches each having a different size degrades aesthetical appearance and is not desirable in terms of interior design.

Figure 16:
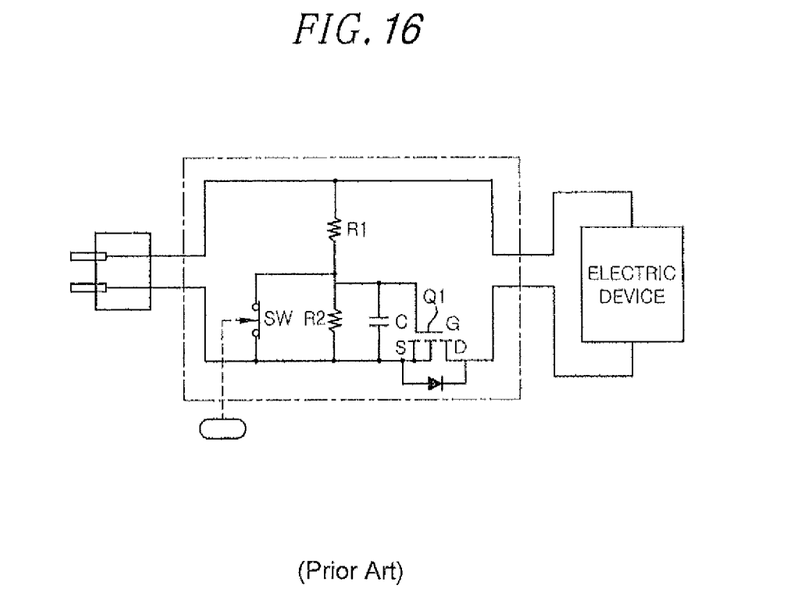
FIG. 16 is a circuit diagram showing a configuration of DC switch as prior art.

There is proposed a DC switch that does not generate an arc by using a MOSFET as shown in FIG. 16 (see, e.g., Japanese Patent Application Publication No. 2005-293317). In the patent, a source of a MOSFET Q1 needs to be connected to a negative electrode of a DC power source, and current can be blocked only at the negative electrode side. However, when a personal protection against an electrical shock or the like is taken into consideration, it is preferred to block the current at a positive electrode side.

Further, when a polarity is erroneously connected between the DC power and the switch, the current flows by way of a diode included in the MOSFET unit, and, accordingly, the MOSFET does not serve as a switch. Furthermore, when the DC power is supplied from a storage battery and the DC switch is used for charging and discharging, a direction in which the current flows is inverted in charging and discharging while supplying a DC voltage. In this case, the MOSFET operates only in either one of the directions of the currents, which makes function as a switch incomplete. In other words, the DC switch cannot be employed in the AC power system in which the flow direction of current is inverted every half period.

SUMMARY OF THE INVENTION

In view of the above, the present invention provides an AC/DC two-way switch capable of being employed in an AC distribution system as well as a DC distribution system; particularly, switching without generating an arc when used in the DC distribution system, and easily substituting for an existing AC distribution system.

In accordance with an aspect of the present invention, there is provided an AC/DC two-way switch connected between an AC power source or a DC power source and a load to control a power supply to the load, including: a bi-directional semiconductor switch element having a transistor structure connected in series between a first input terminal connected to a power source and a first output terminal connected to the load; and a rectifying unit connected in parallel between the first input terminal and a second input terminal. Further, the AC/DC two-way switch includes; a power source unit for converting an output voltage from the rectifying unit into a stable voltage; a controller for controlling an entire operation of the AC/DC two-way switch by using a power supplied from the power source unit; and a driving unit for turning on the bi-directional semiconductor switch element in response to a control signal from the controller.

With the above configuration, since power supply to a load is controlled by using a bi-directional semiconductor switch having a transistor structure, the AC/DC two-way switch does not have directional dependency on an input current or voltage. Therefore, the switch can be used regardless of being connected to an AC power source or DC power source. In addition, even when a positive electrode and a negative electrode of DC power source are inversely connected, the AC/DC two-way switch can be operated (electrically connection/disconnection) and a switching function is secured.

Further, the AC/DC two-way switch includes the bi-directional semiconductor switch element. Therefore, even when the AC/DC two-way switch is used for a DC distribution system, the switch can be opened and closed without generating an arc. Accordingly, there is no need to prepare a device for extinguishing an arc. Furthermore, as the semiconductor element becomes smaller and smaller, the AC/DC two-way switch can substitute for a switch in an existing AC distribution system.

The bi-directional semiconductor switch element may include inversely connected two switch elements each having a high voltage-withstanding vertical transistor structure.

With this configuration, since the bi-directional semiconductor switch is formed of inversely connected switching elements having a high voltage-withstanding type vertical transistor structure, the bi-directional semiconductor switch can be prepared by using a switch element having a general structure, e.g., an easily available and inexpensive Si-MOSFET or the like. Especially, when a switch element such as a low loss SiC or the like is used, a large load can be controlled.

Further, the bi-directional semiconductor switch element may have a lateral single-gate transistor structure including: a first and a second electrode connected in series between the first input terminal and the first output terminal and formed on a surface of a substrate; an intermediate potential unit having at least a portion formed on the surface of the substrate and having an intermediate potential with respect to the potential of the first electrode and that of the second electrode; and a control electrode having at least a portion connected on the intermediate potential unit and controlling the intermediate potential unit, wherein the intermediate potential unit and the control electrode are disposed at a distance at which a certain withstand voltage can be obtained, from the first and second electrodes.

With this configuration, an intermediate potential unit is formed at a distance at which the certain withstand voltage can be obtained, from the first electrode and the second electrode. Therefore, even when a threshold value voltage of a signal applied to the control electrode is lowered to the lowest level required, the bi-directional semiconductor element can be reliably turned on or off, thereby achieving a low ON-resistance. As a result, heating during an electrical connection can be suppressed to a low level, and a compact, large capacity AC/DC two-way switch can be realized.

The bi-directional semiconductor switch element may have a lateral single-gate transistor structure including: a first and a second electrode connected in series between the first input terminal and the first output terminal and formed on a surface of a substrate; and a first and a second control electrode having at least a portion formed on the surface of the substrate and receiving an independent control signal, wherein the first and second control electrodes are spaced with a distance at which a certain withstand voltage can be obtained.

With this configuration, the first and second control electrodes are spaced with a distance at which a certain withstand voltage can be obtained, and the one voltage-withstanding portion is enough. Therefore, a low loss bi-directional element can be achieved. Further, since heating during an electrical connection can be suppressed at low level, and a compact, large capacity AC/DC two-way switch can be realized.

The rectifying unit may be a half-wave rectification circuit operable only when an anode of a diode included in the rectifying unit is connected to the first input terminal and a positive electrode of the DC power source is connected to the first input terminal.

With this configuration, when the AC/DC two-way switch is connected with the AC power source, power rectified by the half-wave rectification circuit is normally supplied to the controller through the power source unit. Meanwhile, in case where the AC/DC two-way switch is connected with the DC power source, and the positive electrode and the negative electrode of the DC power source are inversely erroneously wired, power is not supplied to the controller by the half-wave rectification circuit, the AC/DC two-way switch does not operate, and power is not supplied to the load. Thus, it can be recognized that the erroneous connection occurs in wiring.

The AC/DC two-way switch may further include: a second rectifying unit connected in parallel between the first output terminal and a second output terminal; and a second power source unit for converting an output voltage from the second rectifying unit into a stable voltage, wherein the controller may control the entire operation of the AC/DC two-way switch based on a power supplied from either one of the power source unit and the second power source unit.

With the above configuration, since the rectifying unit and the power source unit are provided at both the input side and the output side of the AC/DC two-way switch, the AC/DC two-way switch can serve as a switch no matter where the load and a power source are connected to either one of the input side and the output side of the AC/DC two-way switch. For example, the AC/DC two-way switch can be applied to a system in which a load itself is a power source, such as a system in which a storage battery is used as the DC power source and a motor is controlled as the load.

The AC/DC two-way switch may further include: a power type determination unit for determining whether a power source connected with the first input terminal and the second input terminal is the AC power source or the DC power source; and a power type informing unit for displaying a determination result.

With this configuration, the type of a power source connected to the switch can be discriminated, and a user can easily recognize the type of the power source and perform maintenance.

Preferably, when a zero-cross of an AC voltage is detected, the power type determination unit determines that the AC power source is connected.

By doing this, the configuration of the power type determination unit can be simplified and the determination becomes facilitated.

Further, when it is determined by the power type determination unit that the AC power source is connected, the controller may output a control signal for electrically connecting the bi-directional semiconductor switch element in synchronization with a zero-cross detection of the power type determination unit.

With this configuration, since the bi-directional semiconductor switch element is turned on in synchronization with a zero-cross detection by the power type determination unit, the bi-directional semiconductor switch element electrically conducts at a low voltage level, which reduces an inrush current.

The AC/DC two-way switch may further include an auxiliary switch element having switching contacts which is connected in parallel with the bi-directional semiconductor switch element.

With this configuration, by using an auxiliary switch element such as a high conductive relay or the like, connected in parallel to the bi-directional semiconductor switch element, it is possible to considerably increase the capacity of a load current. When the opening and closing unit is turned off, the controller first turns off the auxiliary switch element and then the bi-directional semiconductor switch element. By doing so, the switching contacts of the auxiliary switch element opens in a state where the bi-directional semiconductor switch element is electrically connected (i.e., both ends of the auxiliary switch element are equi-potential) and, accordingly, no arc occurs even when the switch is connected to the DC power source. As a result, a lifespan shortening due to degradation of the switching contacts does not occur.

The AC/DC two-way switch may further include an auxiliary switch element having switching contacts which is connected in series to the bi-directional semiconductor switch element.

With this configuration, when the AC/DC two-way switch is turned off, the opening and closing unit is made completely open and thus no current is supplied to the load.

The AC/DC two-way switch may further include a communications function unit for transmitting a signal to and receiving from an external device.

With this configuration, a user can remotely or automatically control ON/OFF operation of the load such as a lighting apparatus or the like, without, e.g., directly having to manipulate the manipulation unit (a wall switch) provided on a wall face.

Preferably, the communications function unit detects a control signal from the external device connected with a power line, the control signal being overlapped with power to be transmitted.

By doing so, since a control signal from an external device connected with a power line is overlapped with power to be transmitted, and the control signal is detected by a signal detection unit, a dedicated communications line or a wireless transceiver is not needed.

The AC/DC two-way switch may further include a second bi-directional semiconductor switch element connected in series between the second input terminal and a second output terminal.

With this configuration, since the opening and closing units 5 are provided at two portions, it is possible to provide a switch usable in a power system such as an AC 200 V system or a photovoltaic power generation system generating DC 300 V, or the like in which it has a higher voltage to ground and a power line has multiple short-circuited portions.

Further, the first output terminal and a second output terminal may have a socket shape.

With this configuration, since the first terminal and second terminal of the output side have a socket type, the AC/DC two-way switch can be easily connected to a load such as a portable lighting apparatus or the like, without being directly connected to a certain load.

BRIEF DESCRIPTION OF THE DRAWINGS

The above and other objects and features of the present invention will become apparent from the following description of embodiments, given in conjunction with the accompanying drawings, in which:

FIG. 5S is a sectional view showing a configuration of a lateral dual-gate transistor element;

DETAILED DESCRIPTION OF THE EMBODIMENT

Hereinafter, embodiments of the present invention will be described in more detail with reference to accompanying drawings which form a part hereof.

Figure 1:
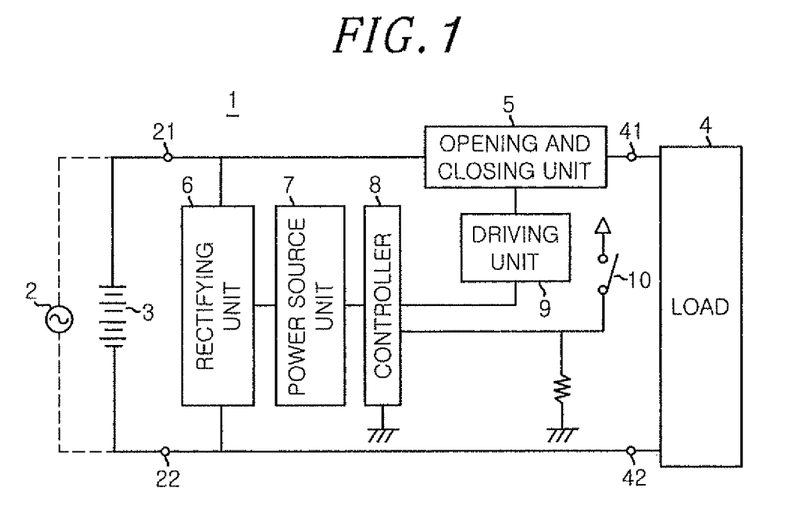
FIG. 1 is a block diagram showing a basic configuration of an AC/DC two-way switch in accordance with an embodiment of the present invention.

An AC/DC two-way switch in accordance with an embodiment of the present invention will be described with reference to the accompanying drawings. FIG. 1 is a block diagram showing a basic configuration of an AC/DC two-way switch 1 in accordance with an embodiment of the present invention.

Referring to FIG. 1, the AC/DC two-way switch 1 is connected between one of an AC power source 2 and a DC power source 3 and a load 4. The AC/DC two-way switch 1 includes an opening and closing unit 5 having a bi-directional semiconductor switch connected in series between a first input terminal 21 to which one side of the AC power source 2 or a positive electrode side of the DC power source 3 is connected and a first output terminal 41 to which one end of the load 4 is connected, and a rectifying unit 6 connected between the first input terminal 21 and a second input terminal 22 to which the other side of the AC power source 2 or a negative electrode side of the DC power source 3 is connected.

Further, the AC/DC two-way switch 1 includes a power source unit 7 for converting an output voltage from the rectifying unit 6 into a certain stable voltage, a controller 8 for controlling an entire operation of the AC/DC two-way switch 1 by using a power supplied from the power source unit 7, and a driving unit 9 for driving the opening and closing unit 5 based on a control signal from the controller 8. Furthermore, the AC/DC two-way switch 1 includes a manipulation unit 10 installed on a surface of a wall or the like and operated by a user, and the like. In FIG. 1, reference numeral 42 denotes a second output terminal to which the other end of the load 4 is connected.

An internal power source of the AC/DC two-way switch 1 includes the rectifying unit 6 and the power source unit 7. Thus, when the AC/DC two-way switch 1 is connected with the AC power source 2, a power is supplied through the rectifying unit 6. On the other hand, when the AC/DC two-way switch 1 is connected to the DC power source 3, a power is directly supplied from the DC power source 3 to the power source unit 7. And thus, the AC/DC two-way switch 1 can be used for both of an AC distribution system and a DC distribution system. Also, the internal power source of the AC/DC two-way switch 1 is not limited thereto, and another power source configuration, such as a switching power source or the like, may be provided.

The manipulation unit 10 may include a mechanical switch having switching contacts, or a remote control switch using a low power radio wave or the like based on an infrared ray or electromagnetic wave. Alternatively, the manipulation unit 10 may include a sensor such as a human body sensor using a superconductivity effect, a timer, or the like. Preferably, the manipulation unit 10 outputs a signal for turning on or off the load 4.

In the present embodiment, the opening and closing unit 5 includes the bi-directional semiconductor switch having a transistor structure that does not have direction dependency on a current or voltage inputted. In this case, when the positive and the negative electrode of the DC power source 3 are inversely connected, a current path is cut off by disconnecting the negative electrode thereof, and, however, the opening and closing unit 5 remains switchable (electrically turning on/off). As a result, a switch function can be secured. Further, as mentioned above, the opening and closing unit 5 can be connected with either one of the AC power source 2 and the DC power source 3.

Figure 2:
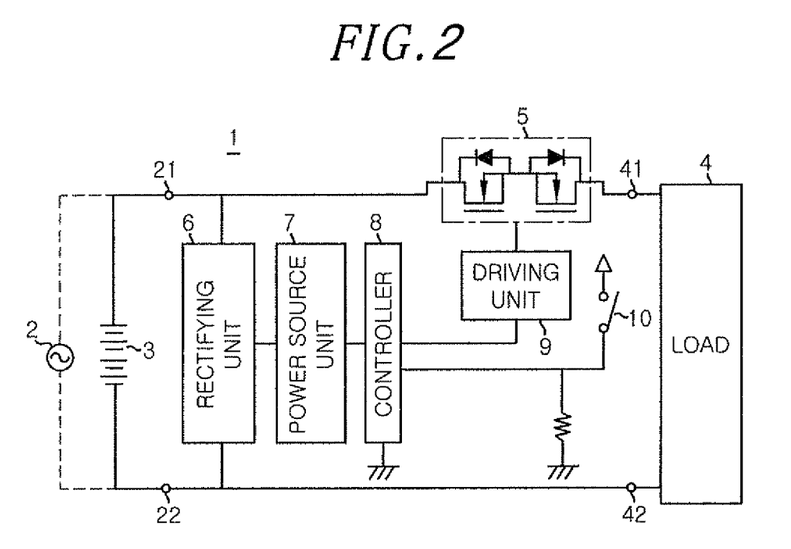
FIG. 2 illustrates a detailed example of an opening and closing unit in the AC/DC two-way switch in which an element of a high voltage-withstanding type vertical transistor structure is inversely connected.

FIG. 2 includes a detailed example of the opening and closing unit 5 shown in FIG. 1, showing a bi-directional semiconductor switch formed of inversely-connected elements of a high voltage-withstanding type vertical transistor structure. With this structure, the bi-directional semiconductor switch can be formed by using a switch element having a general structure, e.g., an easily available and inexpensive Si-MOSFET or the like. Further, a large capacitive load may be controlled by using a switch element such as a low-loss SiC or the like in the above structure.

Figure 3:
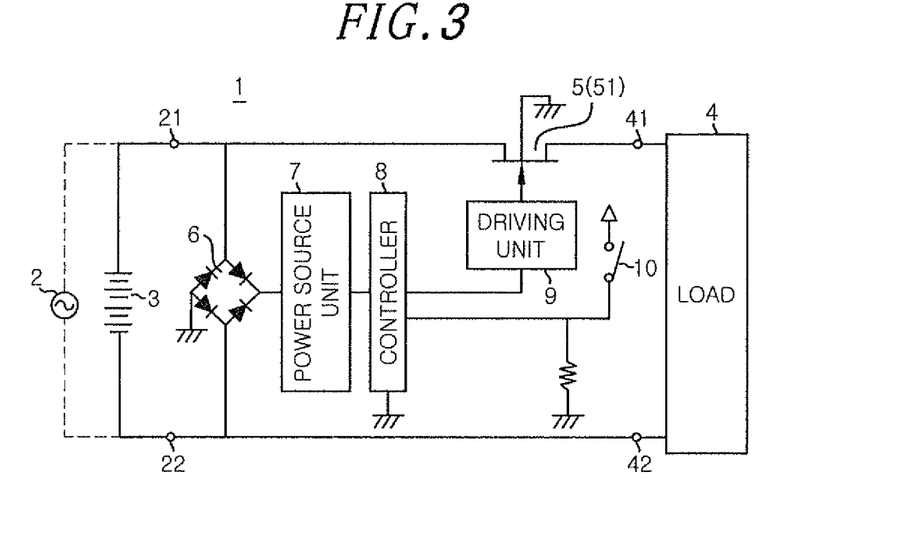
FIG. 3 depicts another detailed example of the opening and closing unit in which a novel bi-directional semiconductor switch element in accordance with the present invention is included.
Figure 4:
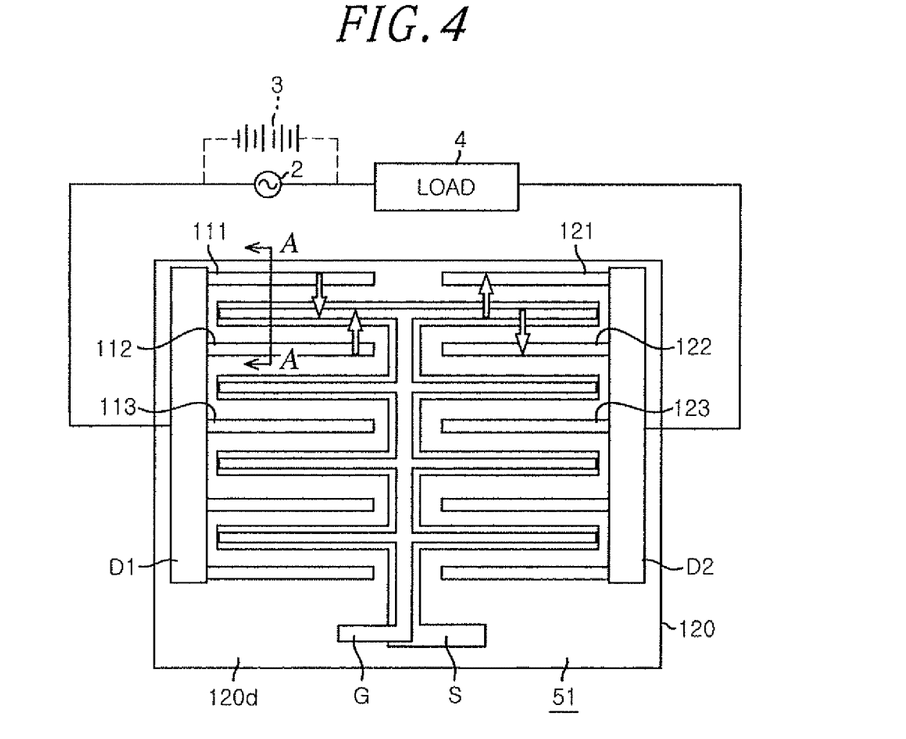
FIG. 4 is a plan view of a detailed configuration of the bi-directional semiconductor switch element shown in FIG. 3.

FIG. 3 shows a detailed example of the opening and closing unit 5 in which a novel bi-directional semiconductor switch element 51 in accordance with the present invention is used. The bi-directional semiconductor switch element 51 is formed of a bi-directionally controllable lateral single-gate transistor element. FIG. 4 is a plan view showing a configuration of the bi-directional semiconductor switch element 51, and FIG. 5A is a sectional view taken along a line A-A shown in FIG. 4.

Figure 5A:
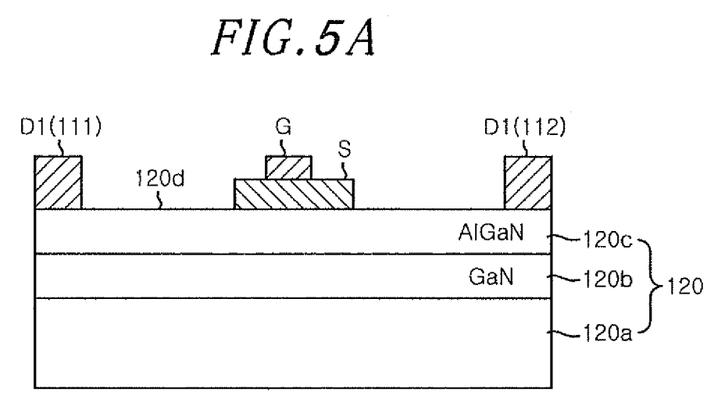
FIG. 5A is a sectional view taken along a line A-A in FIG. 4.

As shown in FIG. 5A, a substrate 120 of the bi-directional semiconductor switch element 51 includes a conductor layer 120a, and a GaN layer 120b and an AlGaN layer 120c stacked in that order on the conductor layer 120a. In the bi-directional semiconductor switch element 51, a two-dimensional (2D) electron gas layer generated at AlgaN/GaN heterogeneous interface is used as a channel layer.

As shown in FIG. 4, on a surface 120d of the substrate 120, there are provided a first electrode D1 and a second electrode D2 connected in series with the power source 2 or 3 and the load 4, and an intermediate potential unit S having an intermediate potential over the potential of the first electrode D1 and that of the second electrode D2. Further, a control electrode (gate) G is stacked on top of the intermediate potential unit S.

As the control electrode G, for example, a short-key electrode is used. The first and second electrodes D1 and D2 have comb-like shapes including multiple electrode units 111, 112, 113, ... and 121, 122, 123, arranged in parallel to each other, respectively. The electrode units arranged in the comb-like shapes are disposed to face each other. Further, the intermediate potential unit S and the control electrode G are disposed between the electrode units 111, 112, 113, ... and 121, 122, 123, ... arranged in the comb-like shapes, and have approximately fish backbone shapes corresponding to planar shapes among the electrode units.

The lateral transistor structure included in the bi-directional semiconductor switch element 51 will now be described. As shown in FIG. 4, the first and second electrodes D1 and D2 are arranged in parallel on the surface 120d such that a central line in a width direction of the electrode unit 111 of the first electrode D1 coincides with that of the electrode unit 121 of the second electrode D2, for example. Accordingly, adjacent portions of the intermediate potential unit S and the control electrodes G are provided in parallel with the electrode unit 111 of the first electrode D1 and the electrode unit 121 of the second electrode D2, respectively.

Herein, a distance to the adjacent intermediate potential unit S and control electrodes G from the electrode unit 111 of the first electrode D1 and the electrode unit 121 of the second electrode D2 in the width direction is set to be a distance from which a certain withstand voltage can be obtained. In a length direction perpendicular to the width direction, a distance to the adjacent intermediate potential unit S and control electrodes G from the ones of the electrode units of the first electrode D1 and the second electrode D2 is set similarly.

Further, these relationships are similar for the other electrode units 112 and 122, 113, and 123, .... In other words, the intermediate potential unit S and the control electrodes G are disposed at positions at which a certain withstand voltage can be obtained with respect to the first and second electrodes D1 and D2.

In the present embodiment, the intermediate potential unit S having an intermediate potential with respect to the potentials of the first electrode D1 and the second electrode D2 and the control electrode G connected to the intermediate potential unit S to control the intermediate potential unit S are disposed at positions at which a certain withstand voltage can be obtained with respect to the first electrode D1 and the second electrode D2. Thus, for example, in case where the first electrode D1 is at a high potential side and the second electrode D2 is at a low potential side, when the bi-directional semiconductor switch element 51 is turned off and a signal of 0V is applied to the control electrode G, a current is reliably cut off at least among the first electrode D1, and the control electrode G and the intermediate potential unit S, i.e., a current is blocked immediately below the control electrode (gate) G.

Meanwhile, when the bi-directional semiconductor switch element 51 is turned on and a signal having a voltage of a certain threshold or higher is applied to the control electrode G, a current flows along a path from the first electrode D1 (electrode units 111, 112, 113, ...), through the intermediate potential unit S, to the second electrode D2 (electrode units 121, 122, 123, ...) as indicated by arrows in FIG. 4 and this holds true for the reversed case, too.

As described above, the intermediate potential unit S is formed at the position at which the certain withstand voltage can be obtained with respect to the first electrode D1 and the second electrode D2. Therefore, even when a threshold voltage of a signal applied to the control electrode G is lowered to the lowest level required, the bi-directional semiconductor element 51 can be reliably turned on and off, thereby realizing a low on-resistance. Also, by having the opening and closing unit 5 to be formed of the bi-directional semiconductor switch element 51 and making a reference (GND) of the control signal have the same potential as that of the intermediate potential unit S, the DC power source 3 or the AC power source 2 of a high voltage can be controlled by the controller 8 which can be driven by a control signal of a few volts.

Further, in the lateral transistor element using the 2D electron gas layer generated at the heterogeneous interface as channel layer, there is a reciprocal relationship between high potentialization of the threshold voltage that makes the element electrically non-conductive and ON-resistance in conducting. Therefore, when the threshold voltage is lowered, ON-resistance can become a low level, which makes it possible to realize the AC/DC two-way switch 1 to be of a high capacity at a small scale.

Figure 6:
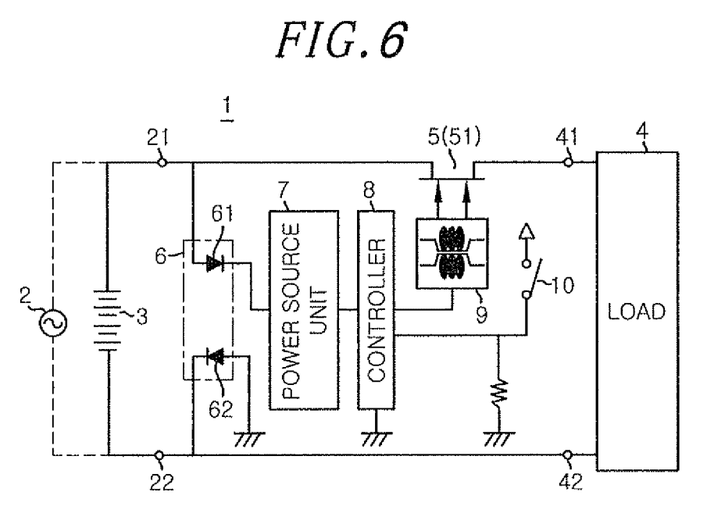
FIG. 6 represents a configuration of a half-wave rectification circuit as a rectifying unit in the AC/DC two-way switch.

FIG. 6 shows a modified example of the configuration illustrated in FIG. 3. In the configuration example illustrated in FIG. 3, the bi-directional controllable lateral single-gate transistor element is used as the bi-directional semiconductor switch element 51, and a full-wave rectification circuit is used in the rectifying unit 6. In the example illustrated in FIG. 6, a bi-directional controllable lateral dual-gate transistor element is used as the bi-directional semiconductor switch element 51 and a half-wave rectification circuit is used as the rectifying unit 6.

Figure 5B:
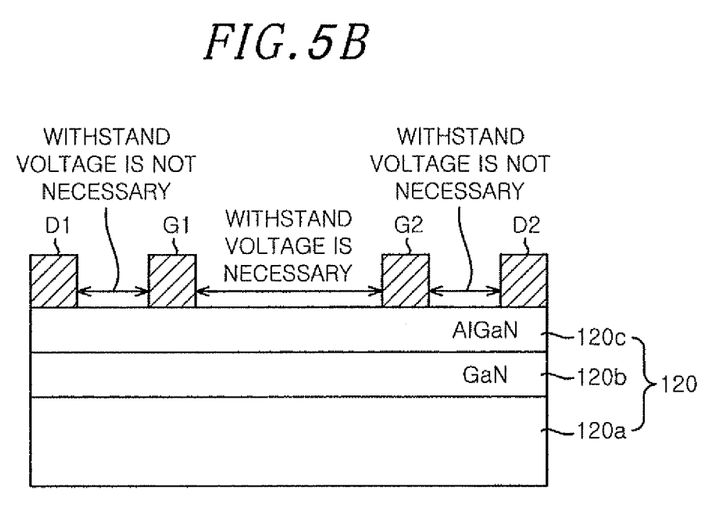

As shown in FIG. 5B, the lateral dual-gate transistor element includes a first electrode D1 and a second electrode D2 connected in series with the power source 2 or 3 and the load 4 and formed on the surface of the substrate 120, and a first control electrode (first gate electrode) G1 and a second control electrode (second gate electrode) G2 each receiving an independent control signal, at least a portion of each of the first and the second control electrode G1 and G2 being formed on the surface of the substrate 120.

Each of the first control electrode G1 and the second control electrode G2 is disposed at a position at which a certain withstand voltage can be obtained. Since the withstand voltage is needed at one portion, a bi-directional element with a low loss can be realized. The element having this configuration is controlled based on the voltages of drain electrodes D1 and D2 as respective references, and different driving signals are inputted to the two gate electrodes G1 and G2, respectively (for that reason, the element is called a dual gate transistor structure).

Referring to FIG. 6 again, an anode of a diode 61 is connected to a first input terminal 21 to which the positive electrode of the DC power source 3 is connected. When the AC/DC two-way switch 1 is connected with the AC power source 2, a power is normally supplied to the controller 8 through the rectifying unit 6, i.e., either the full-wave rectification circuit or the half-wave rectification circuit as the rectifying unit 6, and the power source unit 7.

Meanwhile, in case where the AC/DC two-way switch 1 is connected with the DC power source 3 and the half-wave rectification circuit is used as the rectifying unit 6, when the positive electrode and the negative electrode of the DC power source 3 are inversely erroneously wired, a power is not supplied to the controller 8. Accordingly, the AC/DC two-way switch 1 does not operate, and a power is not supplied to the load 4. As a result, it is possible to recognize that the element is erroneously connected in wiring.

In the modified example shown in FIG. 6, a diode 62 is connected to the second input terminal 22 to which the negative electrode of the DC power source 3 is connected as well. However, the operation is similarly performed even when the diode 61 is connected only to the first input terminal 21 to which the positive electrode of the DC power source 3 is connected.

In the present embodiment, the driving unit 9 has an insulating structure such as a transformer or the like in which a primary side thereof is connected with the controller 8 and a secondary side thereof is connected with the control electrodes G1 and G2 of the bi-directional semiconductor switch element 51. When a signal for turning on the load 4 is received from the manipulation unit 10, the controller 8 supplies a certain power to the primary side of the transformer of the driving unit 9. Then, a certain voltage is induced at the secondary side of the transformer.

Accordingly, a control voltage is applied to the control electrodes G1 and G2 of the bi-directional semiconductor switch element 51 based on the induced voltage, thereby electrically conducting (closing) the bi-directional semiconductor switch element 51, i.e., the opening and closing unit 5. Herein, since the primary side and the secondary side of the transformer are insulated, the controller 8 may make a high voltage be applied or a large current flow through the opening and closing unit 5 without damage. Further, the insulating structure is not limited to the transformer and may use a light emitting element and a light receiving element such as a photo-coupler, or the like.

Figure 7:
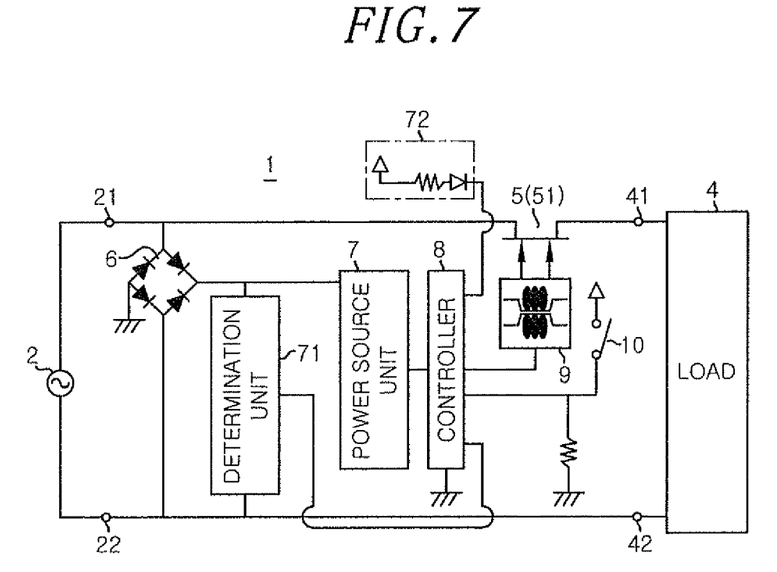
FIG. 7 shows a configuration of an AC/DC two-way switch further including a power type determination unit and a power type informing unit.

FIG. 7 shows a configuration including a power type determination unit 71 and a power type informing unit 72. A detailed configuration and a determination method of the power type determination unit 71 are not particularly limited. For example, the controller 8 may compare a threshold with an analog value obtained by stepping down an input voltage by a certain magnification. Alternatively, a filter or the like including a condenser, a coil or the like may be used to split a DC and an AC. Further, a detailed configuration and method of the power type informing unit 72 are not also particularly limited. For example, two LEDs each having a different light emitting color may be used in which LEDs for lighting are switched depending on an AC or a DC, or a single LED may be used in which the LED is switched between lighting constantly and flickering depending on an AC or a DC.

As the above, since the power type determination unit 71 and the power type informing unit 72 are provided, even in the distribution system in which the AC power source 2 and the DC power source 3 coexist, the types of the power sources connected with respective switches can be recognized, thereby facilitating user's recognition and making maintenance easier.

Figure 8A:
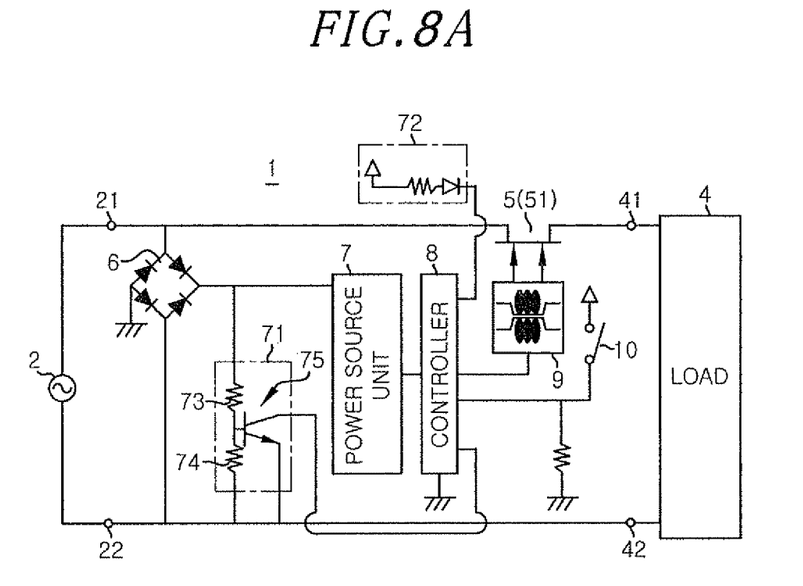
FIG. 8A illustrates a configuration of a power type determination unit in which a zero cross of an input voltage is detected.

FIG. 8A shows a detailed example of the power type determination unit 71 in which a zero cross of an input voltage is detected. As shown in FIG. 8A, an input voltage from the rectifying unit 6 is divided by resistors 73 and 74, and the divided voltage is applied between an emitter and a base of the transistor 75. And, the controller 8 monitors a terminal voltage of a collector of the transistor 75. When the AC/DC two-way switch 1 is connected with the AC power source 2, a ripple current rectified by the rectifying unit 6 is inputted to the power type determination unit 71.

Figure 8B:
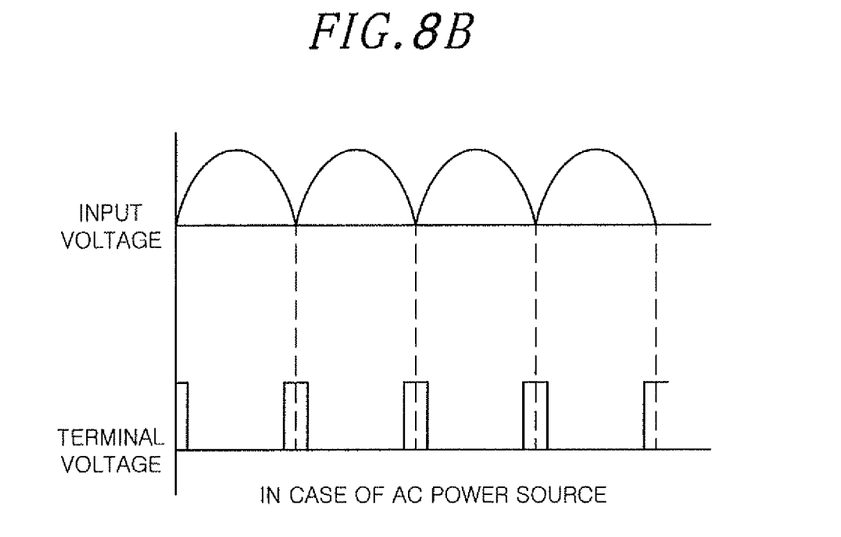
FIG. 8B depicts waveforms of an input voltage and a monitored terminal voltage when an AC power source is connected.

When the input voltage is greater than a threshold value of the transistor 75, the transistor 75 is turned on, and the terminal voltage of the collector becomes lower than a determination threshold value (LOW). Meanwhile, when the input voltage is smaller than the threshold value of the transistor 75, the transistor 75 is turned off and the terminal voltage of the collector becomes higher than the determination threshold value (HIGH) (see FIG. 8B). Thus, the power type determination unit 71 outputs a detect signal (pulse) only during a certain period of time before and after the input voltage is zero-crossed.

Figure 8C:
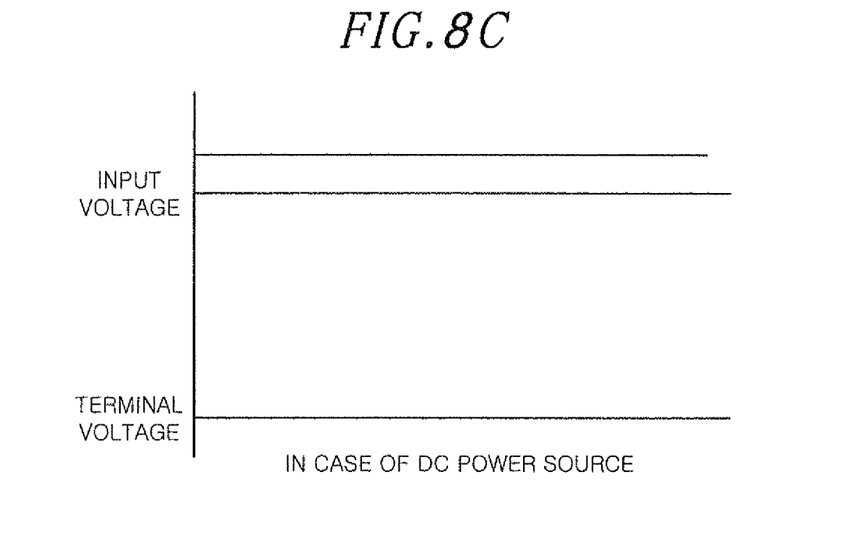
FIG. 8C shows waveforms of an input voltage and a monitored terminal voltage when a DC power source is connected.

On the other hand, when the AC/DC two-way switch 1 is connected with the DC power source 3, the input voltage is constant as shown in FIG. 8C. Accordingly, the transistor 75 is kept in an ON state and the terminal voltage of the collector constantly has a value lower than the determination threshold value (constantly LOW). Thus, if the terminal voltage of the collector periodically becomes higher than the threshold value, it may be determined that the AC/DC two-way switch 1 is connected with the AC power source 2. With the present embodiment detecting the zero-cross, the circuit configuration can be simplified, the controller 8 can make determination based on a digitized signal, and the controller 8 can easily perform processing.

Figure 8D:
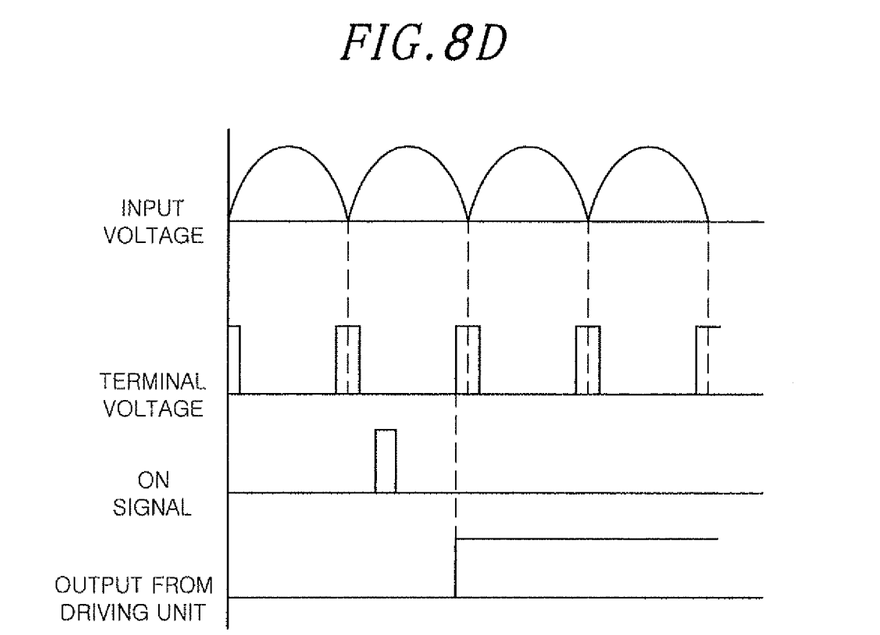
FIG. 8D shows waveforms of principal parts when the opening and closing unit conducts electrically in synchronization with a zero-cross detection.

As shown in FIG. 8D, a timing for turning on the bi-directional semiconductor switch element 51 (i.e., a timing for driving the driving unit 9) may be set to be in synchronization with a zero-cross detection by the power type determination unit 71, other than an ON signal from the manipulation unit 10. By doing so, since the bi-directional semiconductor switch element 51 is electrically connected at a low voltage level, an inrush current can be reduced.

Figure 9:
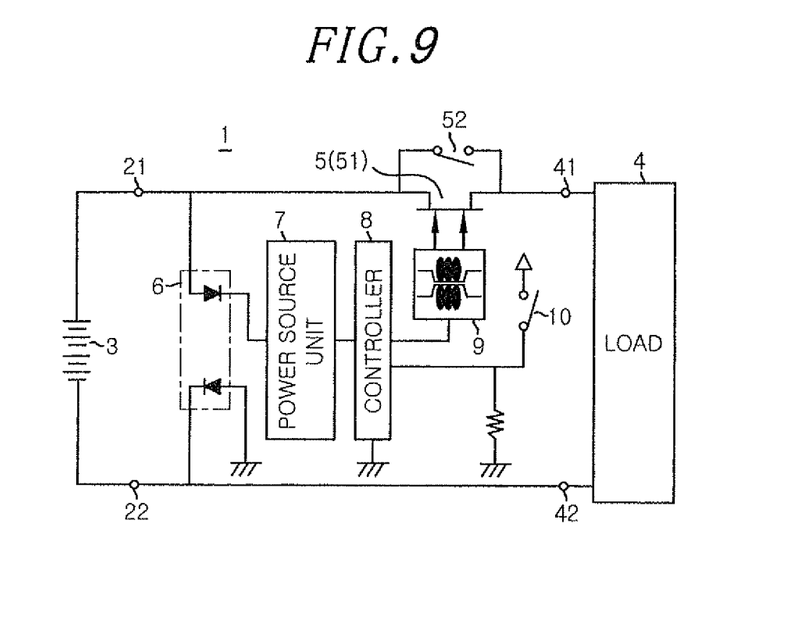
FIG. 9 represents a configuration of an AC/DC two-way switch in which an auxiliary switch element having mechanical switching contacts is connected in parallel to the bi-directional semiconductor switch element.

FIG. 9 illustrates a configuration in which an auxiliary switch element 52 having mechanical switching contacts is connected in parallel to the bi-directional semiconductor switch element 51 as the opening and closing unit 5. As for the auxiliary switch element 52, for example, a relay or the like may be used. When the controller 8 supplies a certain power to the driving unit 9 or outputs a certain driving signal, the opening and closing unit 5 becomes conductive. After the bi-directional semiconductor switch element 51 of the opening and closing unit 5 becomes conductive, the auxiliary switch element 52 becomes conductive.

In the present embodiment, by using the auxiliary switch element 52 such as a relay or the like having high electrical conductivity, the capacity of a load current can be considerably increased. When the opening and closing unit 5 is made non-conductive, the controller 8 first opens the auxiliary switch element 52 and then makes the bi-directional semiconductor switch element 51 non-conductive. Accordingly, the switching contacts of the auxiliary switch element 52 are open in a state that the bi-directional semiconductor switch element 51 is electrically connected (i.e., both ends of the auxiliary switch element 52 are equi-potential). As a result, there develops no arc used to occur in the DC power source 3, thereby preventing a life span problem due to a degradation of the switching contacts.

Figure 10:
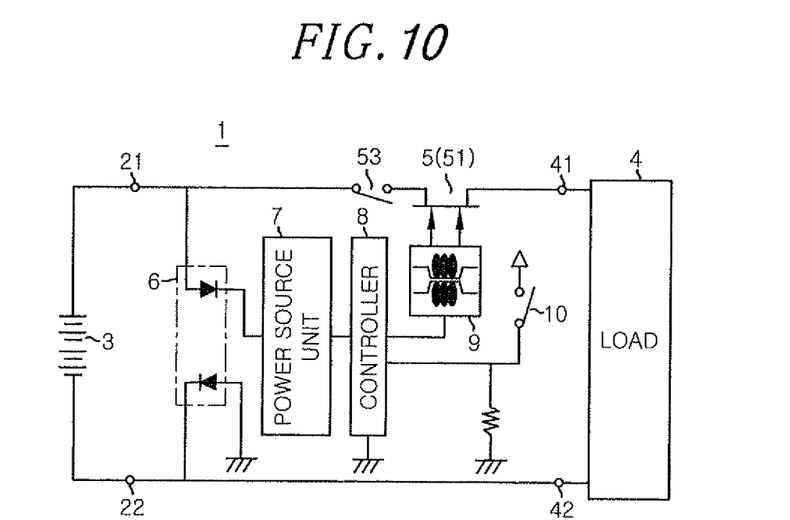
FIG. 10 depicts a configuration of an AC/DC two-way switch in which an auxiliary switch element having mechanical switching contacts is connected in series with the bi-directional semiconductor switch element.

FIG. 10 shows a configuration in which an auxiliary switch element 53 having mechanical switching contacts is connected in series with the bi-directional semiconductor switch element 51 included in the opening and closing unit 5. The auxiliary switch element 53, e.g., a relay or the like may be used. When the opening and closing unit 5 is made conductive, the controller 8 supplies a certain power to the driving unit 9, or outputs a certain driving signal. In this case, after the switching contacts of the auxiliary switch element 53 in the opening and closing unit 5 are connected, the bi-directional semiconductor switch element 51 is made conductive.

Further, when the opening and closing unit 5 is made non-conductive, the controller 8 first makes the bi-directional semiconductor switch element 51 of the opening and closing unit 5 non-conductive and then disconnects the auxiliary switch element 53. Accordingly, the opening and closing unit 5 becomes completely non-conductive, and no current flows into the load 4. That is, when the AC/DC two-way switch 1 is turned off, the load 4 is insulated.

Figure 11:
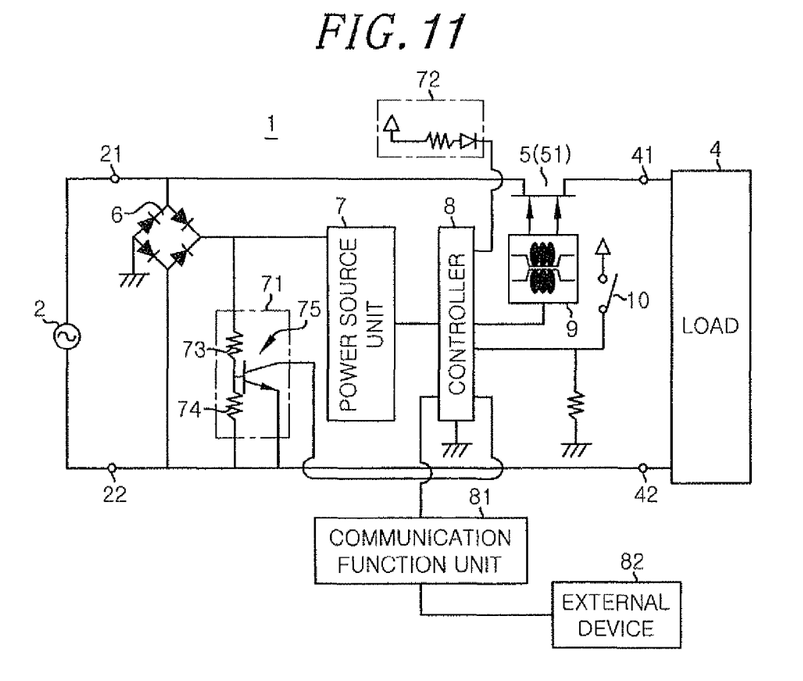
FIG. 11 illustrates a configuration of an AC/DC two-way switch including a communications function unit capable of transmitting and receiving a signal to/from an external device.
Figure 12:
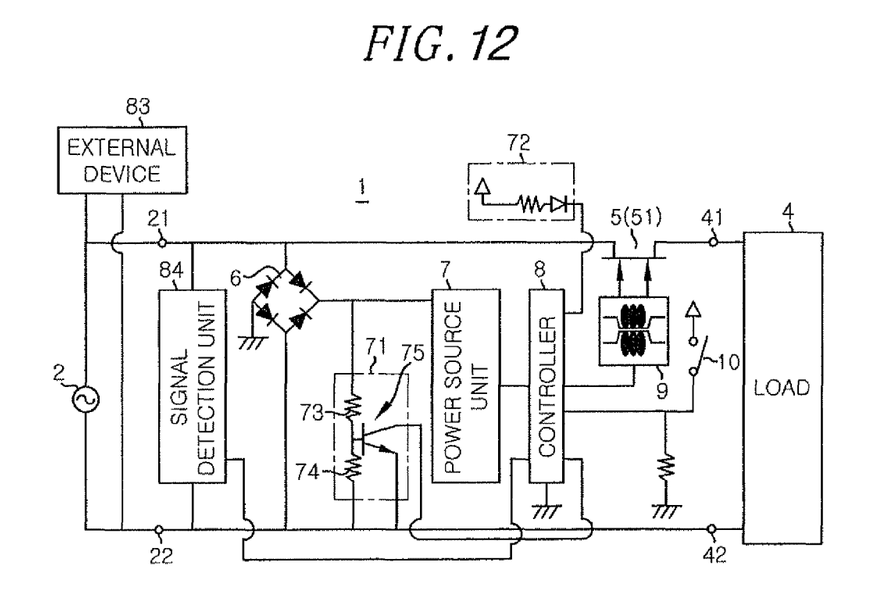
FIG. 12 shows a configuration of an AC/DC two-way switch in which a control signal from an external device is overlapped with power thereof to be transmitted, and detected by a signal detection unit.

FIG. 11 illustrates a configuration including a communications function unit (or a signal reception unit) 81 for transmitting and receiving a signal to and from an external device 82 such as a remote controller device or the like. FIG. 12 represents a modified example from that shown in FIG. 11 in which a control signal from an external device 83 connected to a power line is overlapped with the power to be transmitted, and the control signal is detected by a signal detection unit 84.

With these configurations, a user can remotely or automatically control ON/OFF operation of the load 4 such as a lighting apparatus or the like, without, for example, directly having to manipulate the manipulation unit 10 provided on the wall. With the configuration shown in FIG. 12, there is no need to provide a dedicated communications line or a wireless transceiver.

Figure 13:
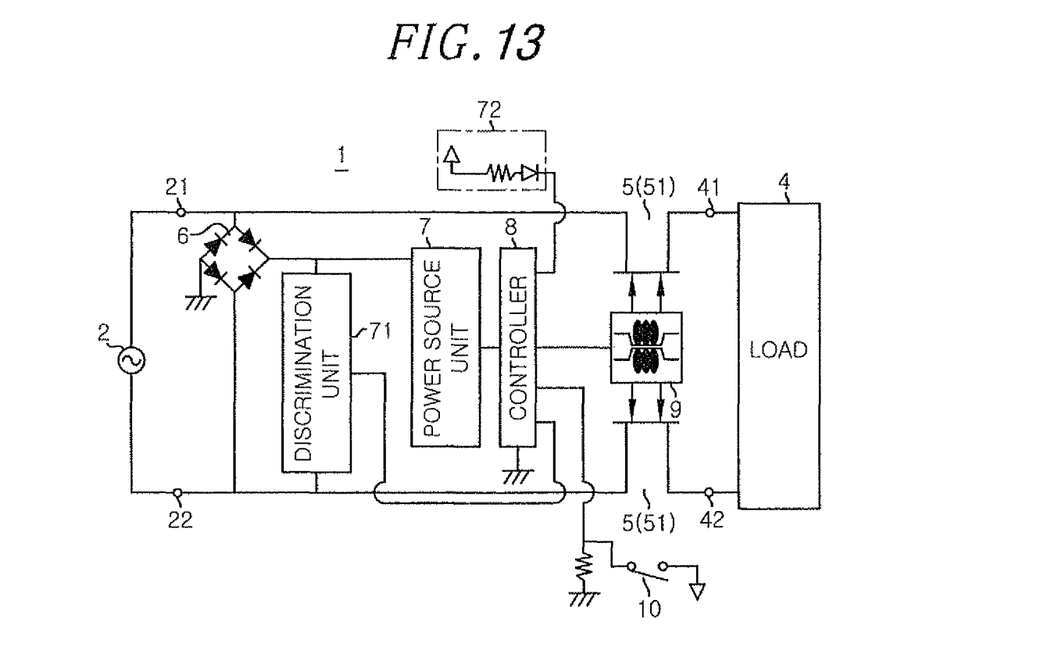
FIG. 13 represents a configuration of an AC/DC two-way switch in which the opening and closing unit is disposed at both positive and negative sides of a power line.

FIG. 13 depicts a configuration in which two opening and closing units 5 are provided at both sides of a power line. With this configuration, a driving signal is simultaneously supplied to the two bi-directional semiconductor switch elements 51 through the driving unit 9 having the insulating structure, and the degree of freedom in the installation of the two bi-directional semiconductor switch elements 51 increases. Further, since the opening and closing units 5 are provided at two portions, it is possible to provide a switch usable in a power system such as an AC 200 V system or a photovoltaic power generation system generating DC 300 V, or the like in which it has a higher voltage to ground and a power line has multiple short-circuited portions. For example, although not shown, the bi-directional semiconductor switch element as an opening and closing unit may be provided at each line of a single-phase three-wire or a three-phase power source, the three opening and closing units being simultaneously opened and closed.

Figure 14:
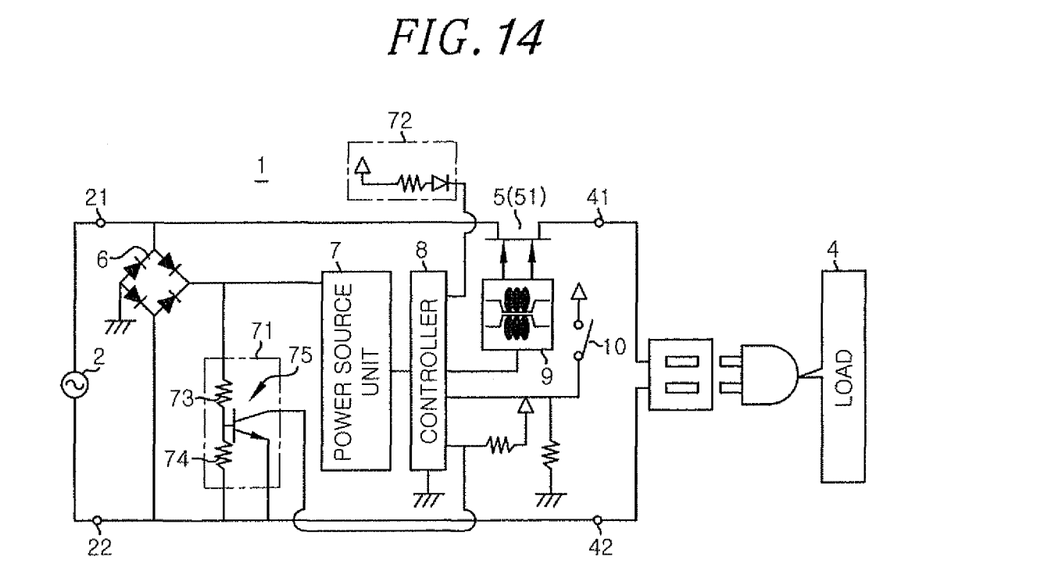
FIG. 14 depicts a configuration of an AC/DC two-way switch in which an output terminal is formed of a socket type output terminal.

Referring to FIG. 14, a configuration is shown in which the AC/DC two-way switch 1 has a socket unit, rather than being directly connected with the load 4. With this configuration, a load such as a portable lighting apparatus or the like can be controlled. The AC/DC two-way switch 1 may be formed of an adapter type switch which can be inserted into an existing socket or may be buried in the wall. In this case, the first output terminal 41 and the second output terminal 42 of the output side may have a general socket shape.

Figure 15A:
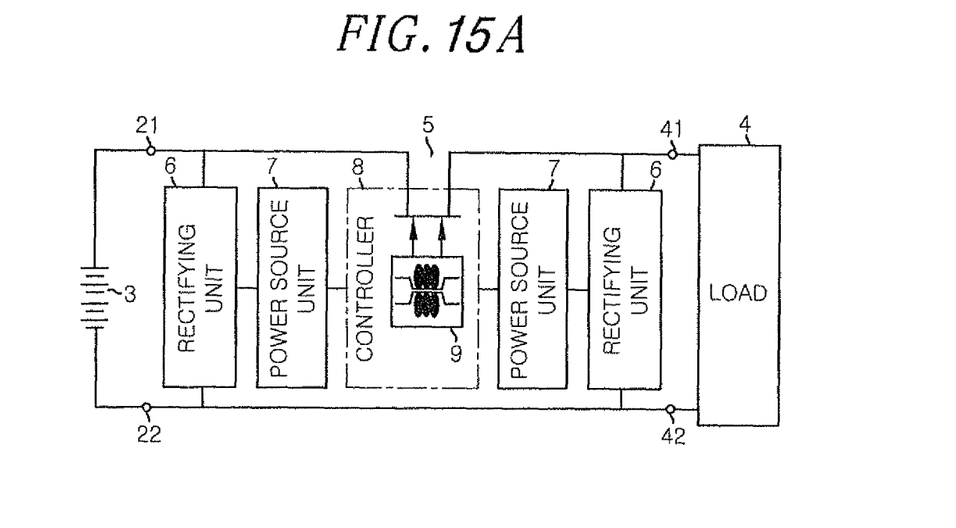
FIGS. 15A and 15B illustrate configurations of AC/DC two-way switches in which a rectifying unit and a power source unit are provided at an input side and an output side of the AC/DC two-way switch, respectively, to thereby function as a switch no matter to which side a load or power is connected.
Figure 15B:
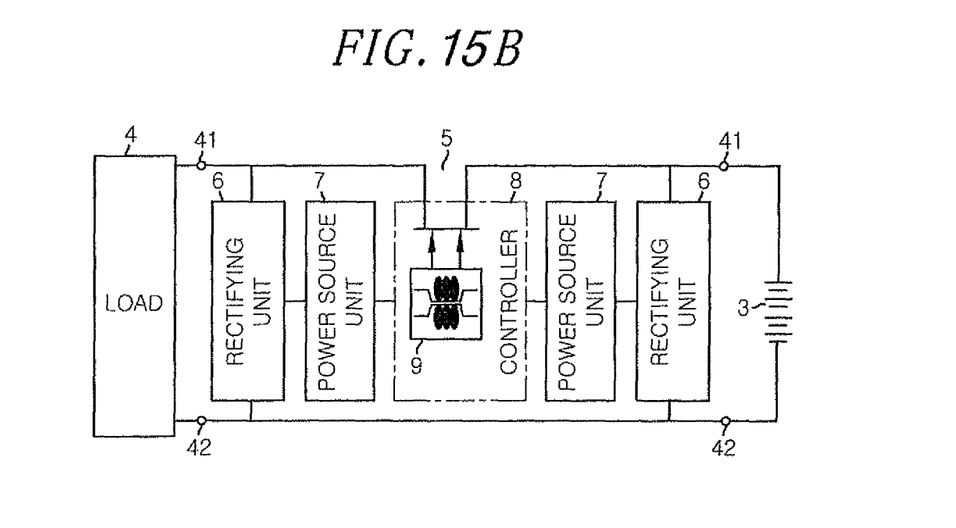

FIGS. 15A and 15B show configurations in which the rectifying units 6 and the power source units 7 both are provided at an input side and an output side of the AC/DC two-way switch 1. With this configuration, the input side and the output side of the AC/DC two-way switch 1 are not limited, and the AC/DC two-way switch 1 may serve as a switch no matter where the load or a power source is connected. For example, the AC/DC two-way switch 1 may be applied to a system in which a load itself also serves as a power source, such as a system in which a storage battery is used as the DC power source 3 and a motor is controlled as the load 4. Specifically, the motor is driven by power from the storage battery, but the motor generates a power as a generator when the motor is idle. In this case, the motor is a power source and the storage battery is a load, and the storage battery can be charged from the power generated by the motor.

As described above, the AC/DC two-way switch 1 in accordance with the above embodiments uses the bi-directional semiconductor switch element 51, as a switch element included in the opening and closing unit, which does not have direction dependency with respect to an input current or voltage. Accordingly, the AC/DC two-way switch 1 can be used in either an AC distribution system or a DC distribution system. Further, when the AC/DC two-way switch 1 is used in the DC distribution system, the AC/DC two-way switch can be opened and closed without generating an arc because of the bi-directional semiconductor switch element. As a result, a device for extinguishing an arc is not required and the AC/DC two-way switch 1 can be substituted for a switch for an existing AC distribution system by reducing the size of the semiconductor element.

Furthermore, the present invention is not limited to the configurations of the forgoing embodiments and, of course, the configuration examples as illustrated may be arbitrarily combined.

What is claimed is:

1. An AC/DC two-way switch to be connected between one of an AC power source and a DC power source and a load to control a power supply to the load, comprising:
    a bi-directional semiconductor switch element having a transistor structure connected in series between a first input terminal to be connected to a power source and a first output terminal to be connected to the load;
    a rectifying unit connected in parallel with the power source between the first input terminal and a second input terminal;
    a power source unit for converting an output voltage from the rectifying unit into a stable voltage;
    a controller for controlling an entire operation of the AC/DC two-way switch by using a power supplied from the power source unit; and
    a driving unit for turning on the bi-directional semiconductor switch element in response to a control signal from the controller.

2. The AC/DC two-way switch of claim 1, wherein the bi-directional semiconductor switch element includes inversely connected two switch elements each having a high voltage-withstanding vertical transistor structure.

3. The AC/DC two-way switch of claim 1, wherein the bi-directional semiconductor switch element has a lateral single-gate transistor structure including:
    a first electrode and a second electrode connected in series between the first input terminal and the first output terminal and formed on a surface of a substrate;
    an intermediate potential unit having at least a portion formed on the surface of the substrate and having an intermediate potential with respect to the potential of the first electrode and that of the second electrode; and
    a control electrode having at least a portion connected on the intermediate potential unit, the control electrode controlling the intermediate potential unit, and
    wherein the intermediate potential unit and the control electrode are disposed at a position which allows a certain withstand voltage to be maintained with respect to the first electrode and the second electrode.

4. The AC/DC two-way switch of claim 1, wherein the bi-directional semiconductor switch element has a lateral dual-gate transistor structure including:
    a first electrode and a second electrode connected in series between the power source and the load and formed on a surface of a substrate; and
    a first control electrode and a second control electrode having at least a portion formed on the surface of the substrate, each receiving an independent control signal, and
    wherein the first control electrode and the second control electrode are disposed at a position which allows a certain withstand voltage to be maintained.

5. The AC/DC two-way switch of claim 1, wherein the rectifying unit is a half-wave rectification circuit, which is operable when an anode of a diode included in the rectifying unit is connected to the first input terminal and a positive electrode of the DC power source is connected to the first input terminal.

6. The AC/DC two-way switch of claim 1, further comprising:
    a second rectifying unit connected in parallel with the load between the first output terminal and a second output terminal; and
    a second power source unit for converting an output voltage from the second rectifying unit into a stable voltage,
    wherein the controller controls the entire operation of the AC/DC two-way switch based on a power supplied from either one of the power source unit and the second power source unit.

7. The AC/DC two-way switch of claim 1, further comprising:
    a power type determination unit for determining whether a power source connected with the first input terminal and the second input terminal is the AC power source or the DC power source; and
    a power type informing unit for displaying a determination result from the power type determination unit.

8. The AC/DC two-way switch of claim 7, wherein, when a zero-cross of an AC voltage is detected, the power type determination unit determines that the AC power source is connected.

9. The AC/DC two-way switch of claim 8, wherein, when it is determined by the power type determination unit that the AC power source is connected, the controller outputs a control signal for electrically connecting the bi-directional semiconductor switch element in synchronization with a zero-cross detection of the power type determination unit.

10. The AC/DC two-way switch of claim 1, further comprising:
    an auxiliary switch element having switching contacts, which is connected in parallel with the bi-directional semiconductor switch element.

11. The AC/DC two-way switch of claim 1, further comprising:
    an auxiliary switch element having switching contacts, which is connected in series to the bi-directional semiconductor switch element.

12. The AC/DC two-way switch of claim 1, further comprising:
    a communications function unit for transmitting and receiving a signal to and from an external device.

13. The AC/DC two-way switch of claim 12, wherein the communications function unit detects a control signal from the external device connected to a power line, the control signal being overlapped with power to be transmitted.

14. The AC/DC two-way switch of claim 1, further comprising:
    a second bi-directional semiconductor switch element connected in series between the second input terminal and a second output terminal.

15. The AC/DC two-way switch of claim 1, wherein the first output terminal and a second output terminal have a socket shape.

* * * * *